(12) United States Patent
Suzuki

(10) Patent No.: US 11,017,854 B2
(45) Date of Patent: May 25, 2021

(54) STORAGE DEVICE HAVING A MEMORY CELL WITH A VARIABLE RESISTANCE ELEMENT, IN WHICH VOLTAGE APPLIED TO A WORD LINE OF THE MEMORY CELL IS CONTROLLED BASED ON VOLTAGE OF A BIT LINE OF THE MEMORY CELL

(71) Applicant: TOSHIBA MEMORY CORPORATION, Tokyo (JP)

(72) Inventor: Kunifumi Suzuki, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/558,905

(22) Filed: Sep. 3, 2019

(65) Prior Publication Data

US 2020/0303006 A1 Sep. 24, 2020

(30) Foreign Application Priority Data

Mar. 20, 2019 (JP) .............................. JP2019-053679

(51) Int. Cl.
*G11C 13/00* (2006.01)
*H01L 27/24* (2006.01)
*H01L 45/00* (2006.01)

(52) U.S. Cl.
CPC ...... *G11C 13/0069* (2013.01); *G11C 13/0026* (2013.01); *G11C 13/0028* (2013.01); *H01L 27/249* (2013.01); *H01L 27/2436* (2013.01); *H01L 45/1253* (2013.01); *H01L 45/141* (2013.01); *H01L 45/148* (2013.01); *G11C 2013/0078* (2013.01)

(58) Field of Classification Search
CPC ............ G11C 13/0069; G11C 13/0026; G11C 13/0028; G11C 2013/0078; H01L 27/2436; H01L 27/249; H01L 45/1253; H01L 45/141; H01L 45/148
See application file for complete search history.

(56) References Cited

U.S. PATENT DOCUMENTS 7,869,294 B2 * 1/2011 Kajigaya ................ G11C 7/067
365/194
7,920,405 B2 * 4/2011 Kang ..................... B82Y 10/00
365/148

(Continued)

FOREIGN PATENT DOCUMENTS

JP 2011-243690 A 12/2011

*Primary Examiner* — Vanthu T Nguyen
(74) *Attorney, Agent, or Firm* — Kim & Stewart LLP

(57) ABSTRACT

A storage device includes a first layer extending in a first direction, a second layer extending in a second direction intersecting the first direction, a third layer extending in a third direction intersecting the first and second directions, a first transistor including a first gate electrode electrically connected to the second layer, a first selection transistor having a first end electrically connected to the third layer and a second end electrically connected to the second layer, a first cell including a first element electrically connected between the first and second layers and to a node of the second layer that is between the first gate electrode of the first transistor and the second end of the first selection transistor, and a circuit turning on the first selection transistor to electrically connect the first cell to the third layer during a write operation performed on the first cell.

13 Claims, 10 Drawing Sheets

(56) References Cited

U.S. PATENT DOCUMENTS

| | | | |
|---|---|---|---|
| 8,895,437 B2 * | 11/2014 | Cernea | ................. H01L 27/249 |
| | | | 438/666 |
| 9,064,547 B2 * | 6/2015 | Cernea | .................... G11C 5/06 |
| 9,184,217 B2 | 11/2015 | Yasutake et al. | |
| 10,083,750 B2 * | 9/2018 | Em | ......................... G11C 8/08 |
| 2011/0104862 A1 | 5/2011 | Kadoya | |

* cited by examiner

STORAGE DEVICE HAVING A MEMORY CELL WITH A VARIABLE RESISTANCE ELEMENT, IN WHICH VOLTAGE APPLIED TO A WORD LINE OF THE MEMORY CELL IS CONTROLLED BASED ON VOLTAGE OF A BIT LINE OF THE MEMORY CELL

CROSS-REFERENCE TO RELATED APPLICATION(S)

This application is based upon and claims the benefit of priority from Japanese Patent Application No. 2019-053679, filed Mar. 20, 2019, the entire contents of which are incorporated herein by reference.

FIELD

Embodiments described herein relate generally to a storage device.

BACKGROUND

In a two-terminal resistive random access memory (ReRAM), a current flows when a voltage is applied across a variable resistance element of memory cells, and the variable resistance element changes from a high resistance state to a low resistance state or from a low resistance state to a high resistance state. Changing the state of the variable resistance element from the high resistance state to the low resistance state is referred to as a set operation, and changing the state from the low resistance state to the high resistance state is referred to as a reset operation. For example, when the high resistance state is defined as data "1" and the low resistance state is defined as data "0", a memory cell stores 1-bit data of "1" and "0".

In the set operation of changing the state of the variable resistance element from the high resistance state to the low resistance state, for example, a write operation to a memory cell and a verification operation of confirming whether or not the write operation has been completed are alternately repeated. In order to avoid excessive application of a voltage to the memory cell, a write voltage is stepped up in a stepwise manner.

However, during the write operation, the write voltage applied to the memory cell is controlled according to time. For this reason, in reality, a write voltage may continue to be applied even after the write operation has been completed and the state of the variable resistance element has changed to the low resistance state. In this case, a large amount of Joule heat is generated in the memory cell, and the characteristics of the memory cell deteriorate. Therefore, the reliability of the resistive random access memory is degraded. For example, the number of times the memory cell is rewritable is reduced, that is, a deterioration in endurance characteristics occurs.

DETAILED DESCRIPTION

Figure 1:
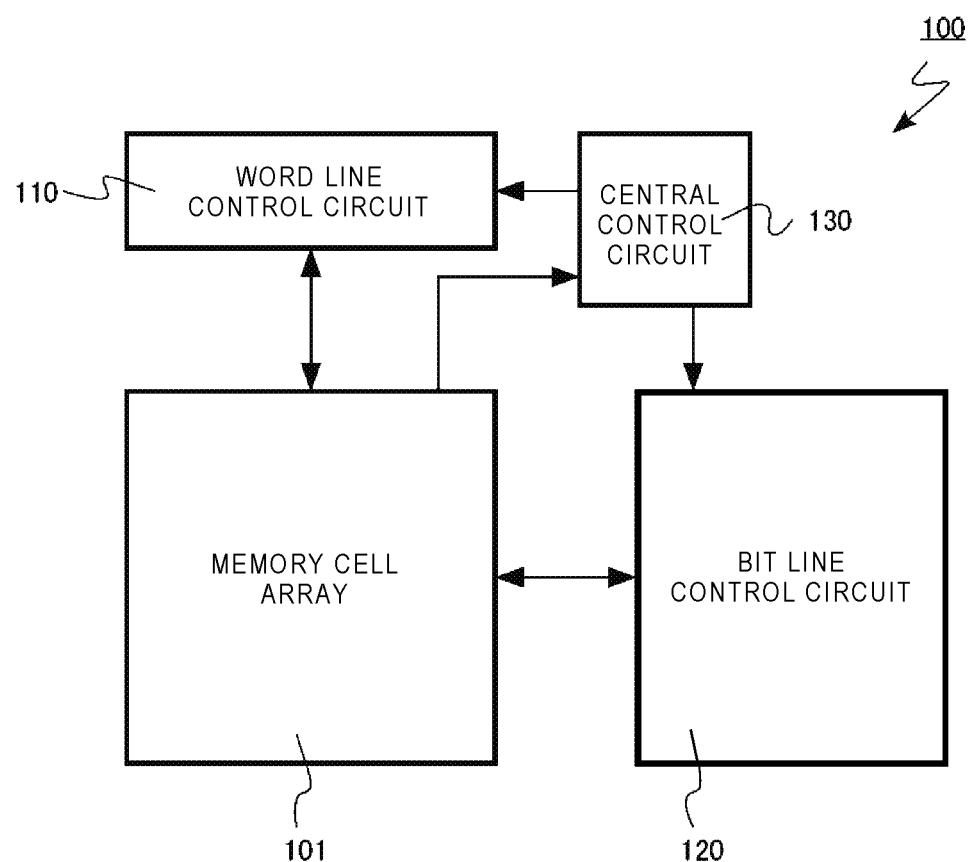
FIG. 1 is a block diagram of a storage device according to a first embodiment.

In general, according to one embodiment, a storage device includes a first conductive layer that extends in a first direction, a second conductive layer that extends in a second direction intersecting the first direction, a third conductive layer that extends in a third direction intersecting the first and second directions, a first transistor that includes a first gate electrode electrically connected to the second conductive layer, a first selection transistor having a first end electrically connected to the third conductive layer and a second end electrically connected to the second conductive layer, a first memory cell including a first variable resistance element electrically connected between the first and second conductive layers and to a node of the second conductive layer that is between the first gate electrode of the first transistor and the second end of the first selection transistor, and a control circuit configured to turn on the first selection transistor to electrically connect the first memory cell to the third conductive layer during a write operation performed on the first memory cell.

Hereinafter, embodiments of the present disclosure will be described with reference to the accompanying drawings. Meanwhile, in the following description, the same or similar elements are denoted by the same reference numerals and signs, and repeated description of those elements and so on will be omitted as appropriate.

In this specification, terms of "above", "below", "upper portion", and "lower portion" may be used for convenience. The terms of "above", "below", "upper portion", and "lower portion" merely indicate a relative positional relationship in the drawings and do not specify a positional relationship with respect to the gravity.

Qualitative analysis and quantitative analysis of the chemical composition of members constituting storage devices in this specification may be performed by, for example, secondary ion mass spectroscopy (SIMS) or energy dispersive X-ray spectroscopy (EDX). In addition, for example, a transmission electron microscope (TEM) may be used to measure thicknesses of each element of the storage devices, distances between the elements, and the like.

Hereinafter, the storage devices of the embodiments will be described with reference to the accompanying drawings.

First Embodiment

A storage device according to a first embodiment includes a first conductive layer extending in a first direction, a second conductive layer extending in a second direction intersecting the first direction, a first variable resistance element provided between the first conductive layer and the second conductive layer, and a first transistor including a first gate electrode electrically connected to the second conductive layer.

Figure 2:
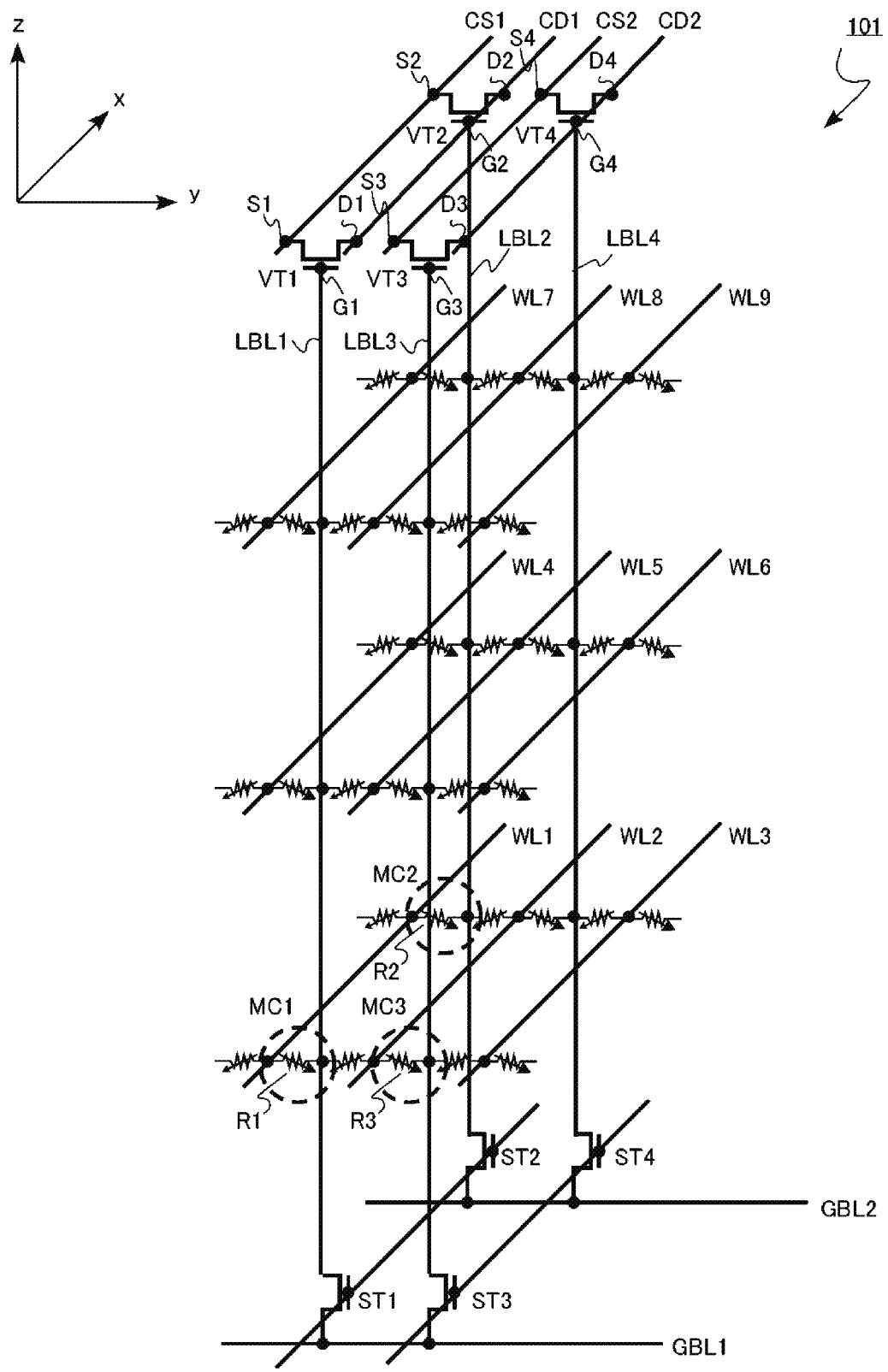
FIG. 2 is an equivalent circuit diagram of a memory cell array of the storage device according to the first embodiment.

FIG. 1 is a block diagram of the storage device according to the first embodiment. FIG. 2 is an equivalent circuit diagram of a memory cell array of the storage device according to the first embodiment. A memory cell array 101 according to the first embodiment includes a three-dimensional structure in which memory cells MC are three-dimensionally arranged.

The storage device according to the first embodiment is a two-terminal resistive random access memory 100. The resistive random access memory 100 is, for example, a phase change memory (PCM).

The phase change memory uses a variable resistance due to a phase change of the variable resistance element. Specifically, the variable resistance element uses a phenomenon in which resistance decreases in a crystalline state and resistance increases in an amorphous state. The memory cell MC of the resistive random access memory 100 includes a variable resistance element containing, for example, a chalcogenide.

As illustrated in FIG. 1, the resistive random access memory 100 includes a memory cell array 101, a word line control circuit 110, a bit line control circuit 120, and a central control circuit 130.

As illustrated in FIG. 2, the plurality of memory cells MC are three-dimensionally arranged in the memory cell array 101. The memory cell array 101 includes, for example, a plurality of word lines WL1 to WL9 and a plurality of local bit lines LBL1 to LBL4. Hereinafter, each of the plurality of word lines WL1 to WL9 will be also referred to simply as a word line WL. In addition, each of the plurality of local bit lines LBL1 to LBL4 will be also referred to simply as a local bit line LBL.

The word line WL extends in an x-direction. The local bit line LBL extends in a z-direction intersecting the x-direction. For example, the word line WL is perpendicular to the local bit line LBL.

The memory cell MC is disposed at an intersection portion between the word line WL and the local bit line LBL. Each of the memory cells MC includes a variable resistance element. A variable resistance element is provided between the word line WL and the local bit line LBL.

For example, a first memory cell MC1 is disposed between the word line WL1 and the local bit line LBL1. The first memory cell MC1 includes a variable resistance element R1. The variable resistance element R1 is provided between the word line WL1 and the local bit line LBL1.

In addition, for example, a second memory cell MC2 is disposed between the word line WL1 and the local bit line LBL2. The second memory cell MC2 includes a variable resistance element R2. The variable resistance element R2 is provided between the word line WL1 and the local bit line LBL2.

In addition, for example, a third memory cell MC3 is disposed between the word line WL2 and the local bit line LBL3. The third memory cell MC3 includes a variable resistance element R3. The variable resistance element R3 is disposed between the word line WL2 and the local bit line LBL3.

The plurality of word lines WL are electrically connected to the word line control circuit 110. The plurality of local bit lines LBL are electrically connected to the bit line control circuit 120.

Select transistors ST1 to ST4 and global bit lines GBL1 and GBL2 are provided between the plurality of local bit lines LBL and the bit line control circuit 120. The global bit lines GBL1 and GBL2 extend in a y-direction intersecting the x-direction and the z-direction. For example, the y-direction is perpendicular to the x-direction and the z-direction.

The plurality of local bit lines LBL are electrically connected to the bit line control circuit 120. A desired local bit line LBL is selected by the select transistors ST1 to ST4, and data of the selected local bit line LBL is transferred to the bit line control circuit 120 through the global bit lines GBL1 and GBL2.

The select transistors ST1 to ST4 control a current flowing between the local bit line LBL and the global bit lines GBL1 and GBL2. For example, the select transistor ST1 controls a current flowing between the local bit line LBL1 and the global bit line GBL1.

Voltage sense transistors VT1 to VT4 are provided above the plurality of local bit lines LBL. The voltage sense transistors VT1 to VT4 respectively include source electrodes S1 to S4, drain electrodes D1 to D4, and gate electrodes G1 to G4.

The gate electrodes G1 to G4 are electrically connected to the local bit lines LBL1 to LBL4. The voltage sense transistors VT1 to VT4 have a function of detecting changes in the voltages of the local bit lines LBL1 to LBL4.

For example, the voltage sense transistor VT1 includes the source electrode S1, the drain electrode D1, and the gate electrode G1. The gate electrode G1 is electrically connected to the local bit line LBL1. The voltage sense transistor VT1 has a function of detecting a change in the voltage of the local bit line LBL1.

For example, the voltage sense transistor VT2 includes the source electrode S2, the drain electrode D2, and the gate electrode G2. The gate electrode G2 is electrically connected to the local bit line LBL2. The voltage sense transistor VT2 has a function of detecting a change in the voltage of the local bit line LBL2.

For example, the voltage sense transistor VT3 includes the source electrode S3, the drain electrode D3, and the gate electrode G3. The gate electrode G3 is electrically connected to the local bit line LBL3. The voltage sense transistor VT3 has a function of detecting a change in the voltage of the local bit line LBL3.

A common source line CS1, a common drain line CD1, a common source line CS2, and a common drain line CD2 extend in the x-direction. The source electrode S1 and the source electrode S2 are electrically connected to each other through the common source line CS1. The drain electrode D1 and the drain electrode D2 are electrically connected to each other through the common drain line CD1. The source electrode S3 and the source electrode S4 are electrically connected to each other through the common source line CS2. The drain electrode D3 and the drain electrode D4 are electrically connected to each other through the common drain line CD2.

The common drain line CD1 and the common drain line CD2 are electrically connected to the central control circuit 130. The common drain line CD1 and the common drain line CD2 have a function of transmitting outputs from the voltage sense transistors VT1 to VT4 to the central control circuit 130.

The word line control circuit 110 includes, for example, a row decoder circuit and a word line driver circuit. The row decoder circuit has a function of selecting a word line WL in accordance with an input row address signal. In addition, the word line driver circuit has a function of applying a predetermined voltage to the selected word line WL.

The bit line control circuit 120 includes, for example, a column decoder circuit and a sense amplifier circuit. The column decoder circuit has a function of selecting a local bit line LBL in accordance with an input column address signal. The sense amplifier circuit has a function of applying a predetermined voltage to the selected local bit line LBL. In addition, the sense amplifier circuit has a function of detecting a current flowing between the selected word line WL and the selected local bit line LBL and amplifying the detected current.

A predetermined voltage is applied between a specific word line WL and a specific local bit line LBL by the word line control circuit 110 and the bit line control circuit 120.

The central control circuit 130 has a function of controlling the word line control circuit 110, the bit line control circuit 120, and other circuits not illustrated in the drawings. The central control circuit 130 has a function of controlling a voltage applied between the word line WL and the local bit line LBL, particularly based on outputs from the voltage sense transistors VT1 to VT4.

For example, the central control circuit 130 has a function of issuing a command to at least one of the word line control circuit 110 and the bit line control circuit 120 and stopping the application of a write voltage between a specific word line WL and a specific local bit line LBL, based on outputs from the voltage sense transistors VT1 to VT4.

The word line control circuit 110, the bit line control circuit 120, and the central control circuit 130 are, for example, semiconductor integrated circuits. The semiconductor integrated circuit includes a transistor using, for example, a semiconductor layer not illustrated in the drawing, and a wiring layer.

Figure 3:
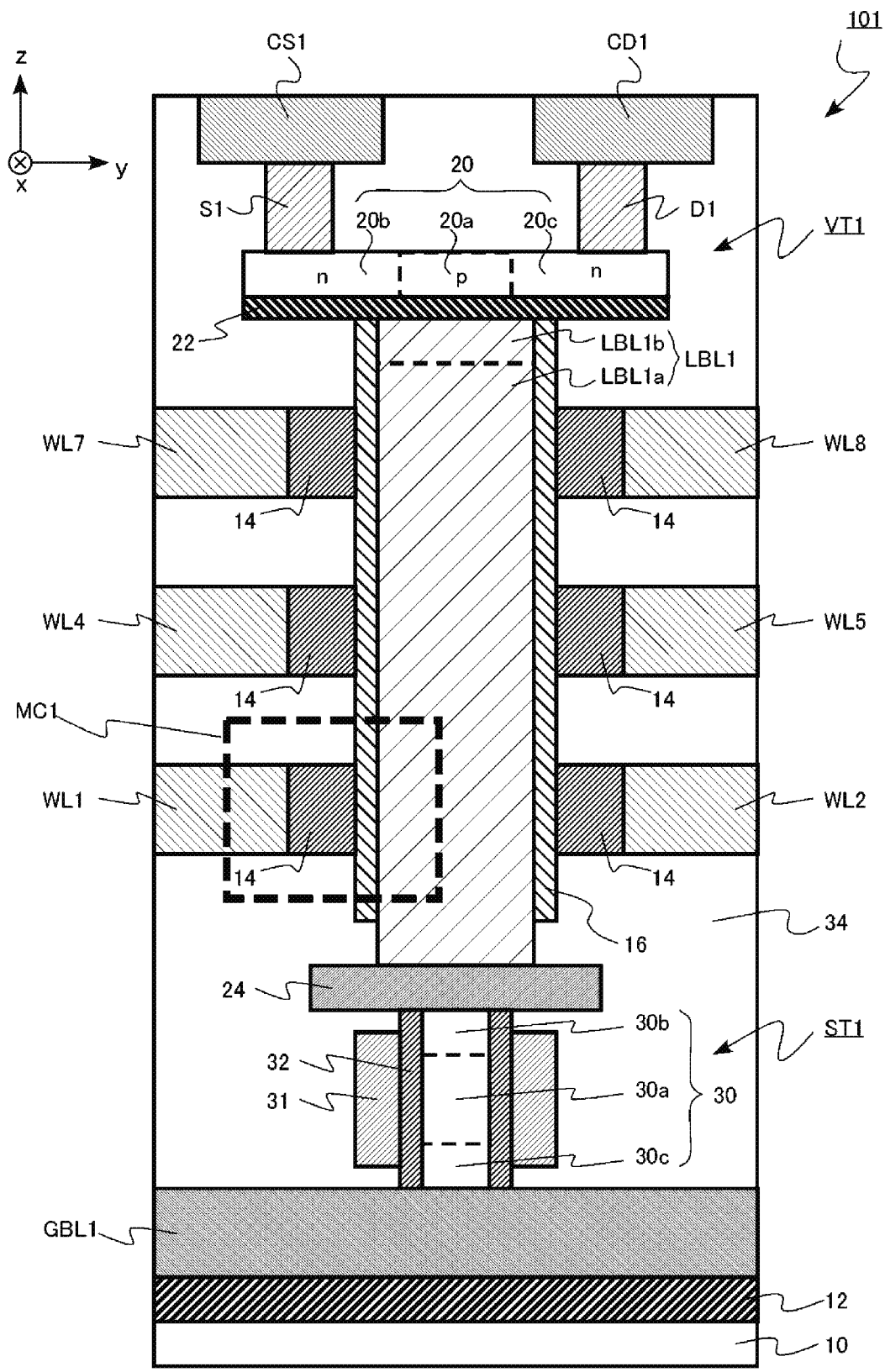
FIG. 3 is a schematic cross-sectional view of the memory cell array of the storage device according to the first embodiment.

FIG. 3 is a schematic cross-sectional view of the memory cell array of the storage device according to the first embodiment. FIG. 3 is a yz cross-sectional view including the local bit line LBL1 of FIG. 2. A yz cross-section of the local bit line LBL other than the local bit line LBL1 is also the same as that in FIG. 3.

FIG. 3 illustrates the word line WL1, the word line WL2, the word line WL4, the word line WL5, the word line WL7, and the word line WL8 among the plurality of word lines WL. FIG. 3 illustrates the local bit line LBL1 and the global bit line GBL1. FIG. 3 illustrates the voltage sense transistor VT1. FIG. 3 illustrates the source electrode S1 and the drain electrode D1. FIG. 3 illustrates the common source line CS1 and the common drain line CD1. FIG. 3 illustrates the select transistor ST1. In FIG. 3, a region surrounded by dashed lines is a memory cell MC1.

The memory cell array 101 includes a semiconductor substrate 10, a substrate insulating layer 12, a variable resistance layer 14, a switching element layer 16, a semiconductor layer 20, a gate insulating layer 22, a pad layer 24, a semiconductor layer 30, a gate electrode 31, a gate insulating layer 32, and an interlayer insulating layer 34.

The semiconductor substrate 10 is formed of, for example, a single crystalline semiconductor. The semiconductor substrate 10 is formed of, for example, single crystalline silicon.

The substrate insulating layer 12 is provided on the semiconductor substrate 10. The substrate insulating layer is formed of, for example, an oxide. The substrate insulating layer 12 is formed of, for example, a silicon oxide.

The word lines WL (WL1, WL2, WL4, WL5, WL7, WL8) extend in the x-direction. The word line WL is formed of, for example, a metal. The word line WL is formed of, for example, titanium nitride (TiN) or tungsten (W).

The local bit line LBL1 extends in the z-direction. The local bit line LBL1 is formed of, for example, a metal. The local bit line LBL1 is formed of, for example, titanium nitride (TiN) or tungsten (W).

The local bit line LBL1 includes a bit line region LBL1a and a gate electrode region LBL1b. The bit line region LBL1a is located on the side of the select transistor ST1. The gate electrode region LBL1b is located on the side of the voltage sense transistor VT1.

The gate electrode region LBL1b is an end portion of the local bit line LBL1 on the side of the voltage sense transistor VT1. The gate electrode region LBL1b works as the gate electrode G1.

The bit line region LBL1a is in contact with the pad layer 24. The gate electrode region LBL1b is in contact with the gate insulating layer 22.

The word line WL, the variable resistance layer 14, the switching element layer 16, and the local bit line LBL1 make up the memory cell MC. Alternatively, the layer 14 may be a switching element layer, and the layer 16 may be a variable resistance layer.

The variable resistance layer 14 is provided between the word line WL and the local bit line LBL1. The variable resistance layer 14 provided between the word line WL1 and the local bit line LBL1 corresponds to the variable resistance element R1.

The variable resistance layer 14 contains, for example, germanium (Ge), antimony (Sb), and tellurium (Te). The variable resistance layer 14 is, for example, a chalcogenide layer containing germanium (Ge), antimony (Sb), and tellurium (Te).

The thickness of the variable resistance layer 14 in the y-direction is, for example, less than or equal to 10 nm.

The switching element layer 16 is provided between the word line WL and the local bit line LBL1. The switching element layer 16 is provided between the variable resistance layer 14 and the local bit line LBL1.

The switching element layer 16 contains, for example, germanium (Ge), selenium (Se), and arsenic (As). The switching element layer 16 is a chalcogenide layer containing, for example, germanium (Ge), selenium (Se), and arsenic (As).

The switching element layer 16 between each of the word lines WL and the local bit line LBL1 functions as a switching element. The switching element layer 16 has a non-linear current voltage characteristic in which a current rises drastically at a specific threshold voltage. The switching element layer 16 has a function of preventing an increase in the semi-select leak current flowing to the semi-select memory cell MC.

The voltage sense transistor VT1 includes the semiconductor layer 20, the source electrode S1, the drain electrode D1, the gate electrode G1, and the gate insulating layer 22.

The semiconductor layer 20 is formed of, for example, a polycrystalline or single crystalline semiconductor. The semiconductor layer 20 is formed of, for example, silicon (Si), germanium (Ge), a nitride semiconductor, or an oxide semiconductor.

The semiconductor layer 20 is provided on the local bit line LBL1. The semiconductor layer 20 includes a channel region 20a, a source region 20b, and a drain region 20c. The channel region 20a is formed of, for example, polycrystalline silicon containing p-type impurities. The source region 20b and the drain region 20c are formed of, for example, polycrystalline silicon containing n-type impurities. The channel region 20a may be formed of, for example, a genuine semiconductor.

The gate electrode region LBL1b of the local bit line LBL1 works as the gate electrode G1. The gate electrode region LBL1b is an end portion of the local bit line LBL1.

The gate insulating layer 22 is provided between the gate electrode region LBL1b and the semiconductor layer 20. The gate insulating layer 22 is in contact with the gate electrode region LBL1b. The gate insulating layer 22 is in contact with the semiconductor layer 20.

The gate insulating layer 22 is formed of, for example, oxide, nitride, or oxynitride. The gate insulating layer 22 is formed of, for example, a silicon oxide or a high dielectric constant material having a dielectric constant higher than that of a silicon oxide. The high dielectric constant material is, for example, a hafnium oxide, a zirconium oxide, an yttrium oxide, or an aluminum oxide.

The source electrode S1 is provided between the common source line CS1 and the semiconductor layer 20. The source electrode S1 is electrically connected to the source region 20b. The source electrode S1 is in contact with the source region 20b.

The drain electrode D1 is provided between the common drain line CD1 and the semiconductor layer 20. The drain electrode D1 is electrically connected to the drain region 20c. The drain electrode D1 is in contact with the drain region 20c.

The source electrode S1 and the drain electrode D1 are formed of, for example, metals. The source electrode S1 and the drain electrode D1 are formed of, for example, titanium nitride (TiN), aluminum (Al), copper (Cu), or tungsten (W).

The common source line CS1 extends in the x-direction. The common source line CS1 is electrically connected to the source electrode S1. The common source line CS1 is in contact with the source electrode S1.

The common drain line CD1 extends in the x-direction. The common drain line CD1 is electrically connected to the drain electrode D1. The common drain line CD1 is in contact with the drain electrode D1.

The common source line CS1 and the common drain line CD1 are formed of, for example, metals. The common source line CS1 and the common drain line CD1 are formed of, for example, titanium nitride (TiN), aluminum (Al), copper (Cu), or tungsten (W).

Figure 4:
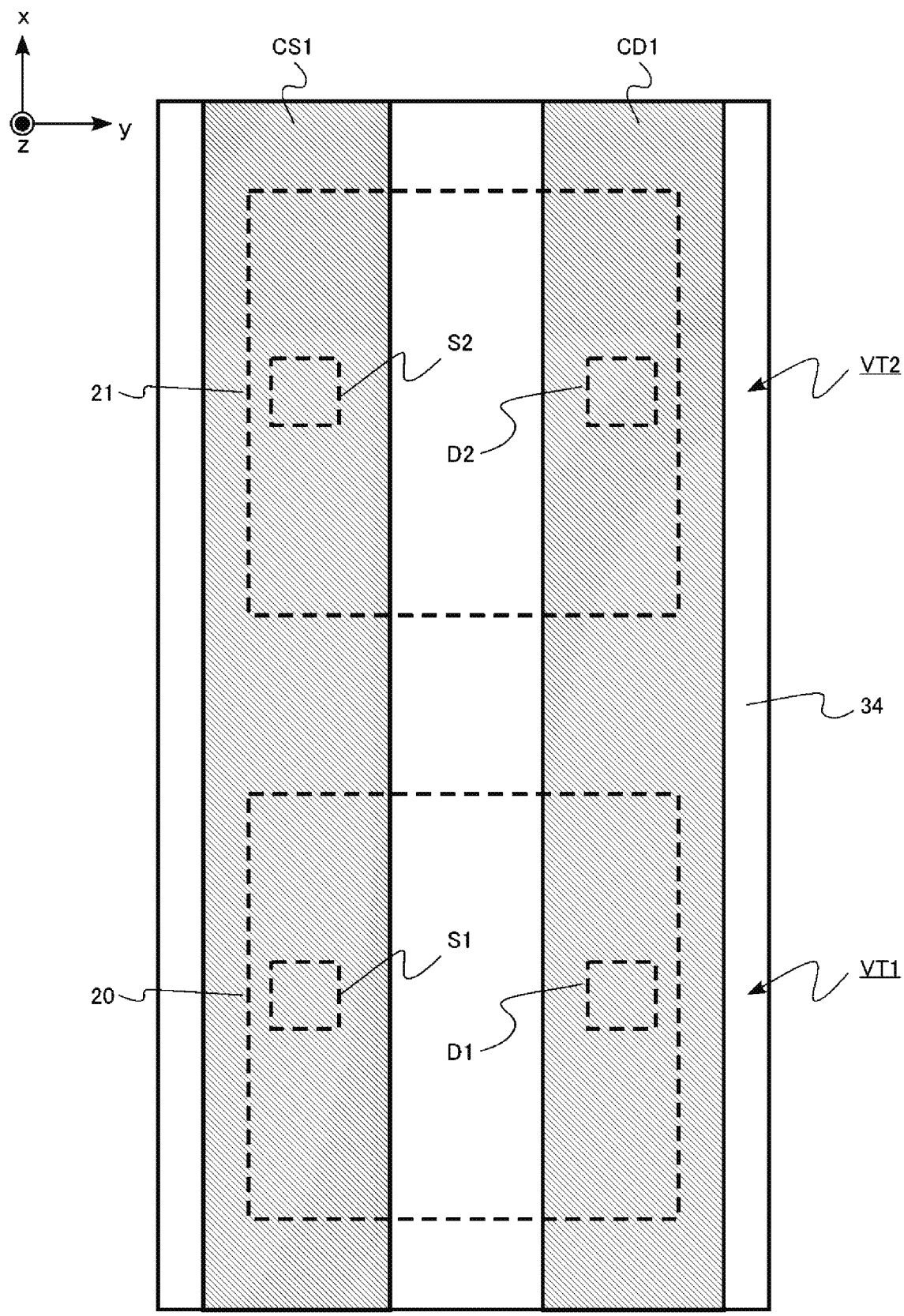
FIG. 4 is a schematic top view of the memory cell array of the storage device according to the first embodiment.

FIG. 4 is a schematic top view of the memory cell array of the storage device according to the first embodiment.

FIG. 4 illustrates the common source line CS1, the common drain line CD1, and the interlayer insulating layer 34. In FIG. 4, the semiconductor layer 20, the source electrode S1, and the drain electrode D1, which make up the voltage sense transistor VT1, are illustrated by a dotted line. In FIG. 4, the semiconductor layer 21, the source electrode S2, and the drain electrode D2, which make up the voltage sense transistor VT2, are illustrated by a dotted line.

The source electrode S1 and the source electrode S2 are electrically connected to each other through the common source line CS1. The drain electrode D1 and the drain electrode D2 are electrically connected to each other through the common drain line CD1.

The global bit line GBL1 is provided between the semiconductor substrate 10 and the local bit line LBL1. The global bit line GBL1 is provided on the substrate insulating layer 12.

The global bit line GBL1 is formed of, for example, a metal. The global bit line GBL1 is formed of, for example, titanium nitride (TiN) or tungsten (W).

The select transistor ST1 is provided between the global bit line GBL1 and the local bit line LBL1. The select transistor ST1 includes the semiconductor layer 30, the gate electrode 31, and the gate insulating layer 32.

The semiconductor layer 30 is formed of, for example, polycrystalline silicon. The semiconductor layer 30 includes a channel region 30a, a source region 30b, and a drain region 30c. The channel region 30a is formed of, for example, polycrystalline silicon containing p-type impurities. The source region 30b and the drain region 30c are formed of, for example, polycrystalline silicon containing n-type impurities. The channel region 30a may be formed of, for example, a genuine semiconductor.

One end of the semiconductor layer 30 is electrically connected to the local bit line LBL1. In addition, the other end of the semiconductor layer 30 is electrically connected to the global bit line GBL1.

For example, the gate electrode 31 is provided to surround the semiconductor layer 30. The gate electrode 31 is formed of, for example, a metal. The gate electrode 31 is formed of, for example, titanium nitride (TiN) or tungsten (W).

The gate insulating layer 32 is provided between the gate electrode 31 and the side surface of the semiconductor layer 30. The gate insulating layer 32 is provided in contact with the semiconductor layer 30.

The gate insulating layer 32 is formed of, for example, oxide, nitride, or oxynitride. The gate insulating layer 32 is formed of, for example, a silicon oxide or a high dielectric constant material having a dielectric constant higher than that of a silicon oxide. The high dielectric constant material is, for example, a hafnium oxide, a zirconium oxide, an yttrium oxide, or an aluminum oxide.

The pad layer 24 is provided between the semiconductor layer 30 and the local bit line LBL1. The pad layer 24 is a conductive layer. The pad layer 24 is formed of, for example, a metal. The pad layer 24 is formed of, for example, titanium nitride (TiN) or tungsten (W).

The interlayer insulating layer 34 is formed of, for example, an oxide. The interlayer insulating layer 34 is formed of, for example, a silicon oxide.

Next, operations and effects of the storage device according to the first embodiment will be described.

In a two-terminal resistive random access memory, a current flows by applying a voltage to a variable resistance element of a memory cell and the state of the variable resistance element changes from a high resistance state to a low resistance state or from a low resistance state to a high resistance state. Changing the state of the variable resistance element from the high resistance state to the low resistance state is referred to as a set operation, and changing the state from the low resistance state to the high resistance state is referred to as a reset operation. For example, when the high resistance state is defined as data "1" and the low resistance state is defined as data "0", a memory cell stores 1-bit data of "1" and "0".

Figure 5:
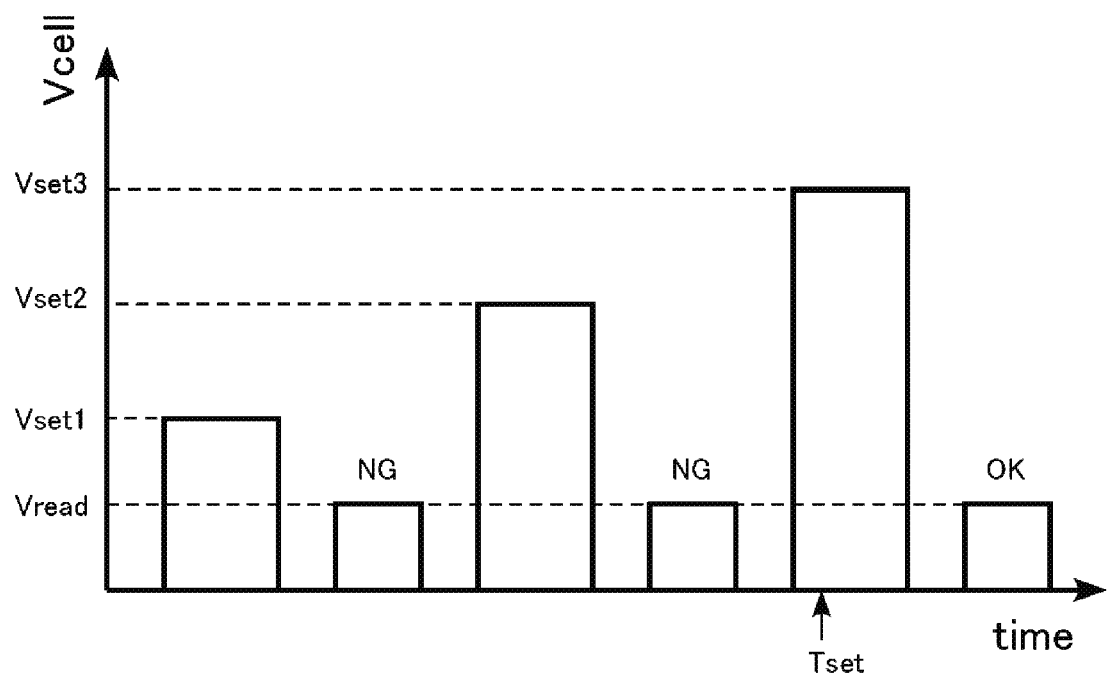
FIG. 5 is a diagram illustrating a set operation using a storage device according to a comparative example.

FIG. 5 is a diagram illustrating the set operation using a storage device according to a comparative example. In FIG. 5, a horizontal axis represents a time, and a vertical axis represents a voltage applied to a memory cell (i.e., Vcell).

In the set operation of changing the state of the variable resistance element from the high resistance state to the low resistance state, a write operation to a memory cell and a verification operation of confirming whether or not the write operation has been completed are alternately repeated, for example, as illustrated in FIG. 5.

In order to avoid excessive application of a voltage to the memory cell, a write voltage of the write operation is stepped up from Vset1 to Vset2 and then, to Vset3 in a stepwise manner. In the verification operation, it is confirmed whether or not the write operation to a memory cell has been completed (OK/NG) at a read voltage Vread lower than the write voltage.

The application of a voltage to the memory cell is performed, for example, by applying a high voltage between the word line WL and the local bit line LBL with the memory cell interposed therebetween. For example, a voltage higher than a voltage to be applied to the local bit line LBL is applied to the word line WL.

For example, a case where write operation is completed at a time Tset while a write voltage Vset3 is applied to a memory cell is considered. Since the state of the variable resistance element has already changed to the low resistance state after the time Tset, a large current flows to the variable resistance element, and a large amount of Joule heat is generated. For this reason, a deterioration in characteristics of the memory cell proceeds, and the reliability of the resistive random access memory is degraded. For example, the number of times the memory cell is rewritable is reduced, that is, a deterioration in endurance characteristics occurs.

Figure 6:
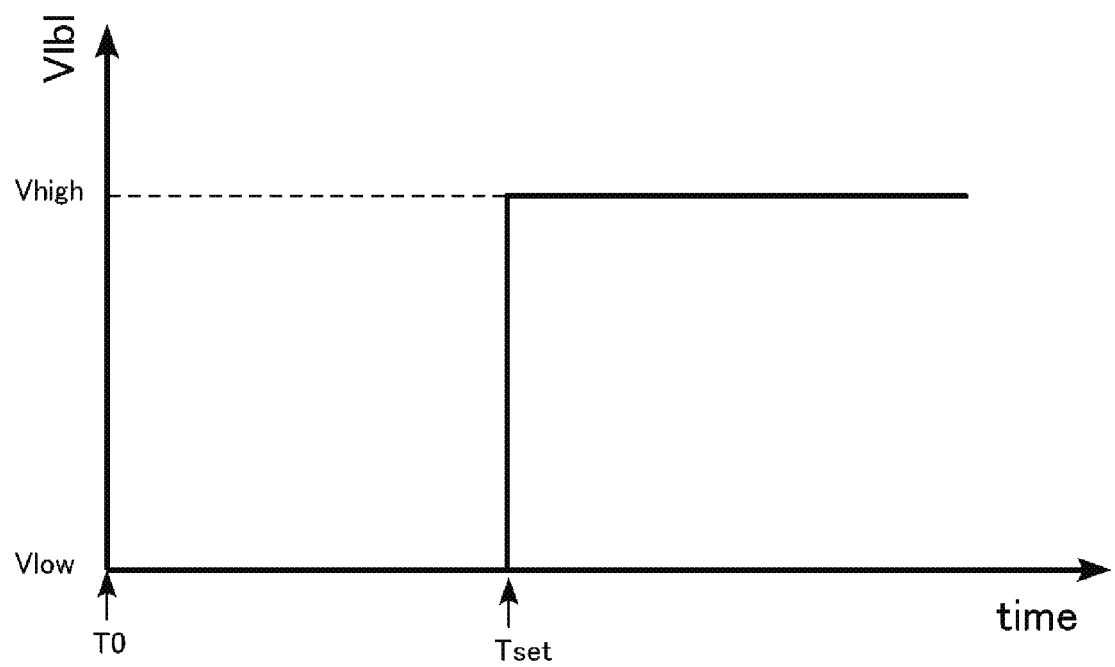
FIG. 6 is a diagram illustrating the operations and effects of the storage device according to the first embodiment.

FIG. 6 is a diagram illustrating operations and effects of the storage device according to the first embodiment. In FIG. 6, a horizontal axis represents a time, and a vertical axis represents a voltage of the local bit line LBL (Vlbl) during a write operation. Hereinafter, a case where the set operation for the memory cell MC1 between the word line WL1 and the local bit line LBL1 will be described as an example.

For example, an start time of the application of the write voltage Vset3 illustrated in FIG. 5 is set to be T0, and a completion time of writing to a memory cell is set to be Tset. As illustrated in FIG. 6, the state of the variable resistance element changes to the low resistance state when the write operation is completed, and thus a voltage of the local bit line LBL1 increases from Vlow to Vhigh. Namely, the word line WL1, the variable resistance element 14, the switching element layer 16, the local bit line LBL1, and the select transistors ST1 are connected in series. When the resistance of the variable resistance element 14 decreases, voltage distribution toward the select transistors ST1 increases, so that the voltage of the local bit line LBL1 increases.

The resistive random access memory 100 according to the first embodiment includes the voltage sense transistor VT1 that detects a change in the voltage of the local bit line LBL1. For example, the gate electrode G1 of the voltage sense transistor VT1 is electrically connected to the local bit line LBL1. Therefore, the voltage of the local bit line LBL1 increases from Vlow to Vhigh, and the voltage sense transistor VT1 is turned on when the voltage exceeds a threshold voltage of the voltage sense transistor VT1.

When the voltage sense transistor VT1 is turned on, a drain current flows between the drain electrode D1 and the source electrode S1 of the voltage sense transistor VT1. It is possible to detect a change in the voltage of the local bit line LBL1 by monitoring a change in the drain current of the voltage sense transistor VT1, that is, a change in the output of the voltage sense transistor VT1. Therefore, it is possible to detect the completion of the write operation on the memory cell MC1.

Figure 7:
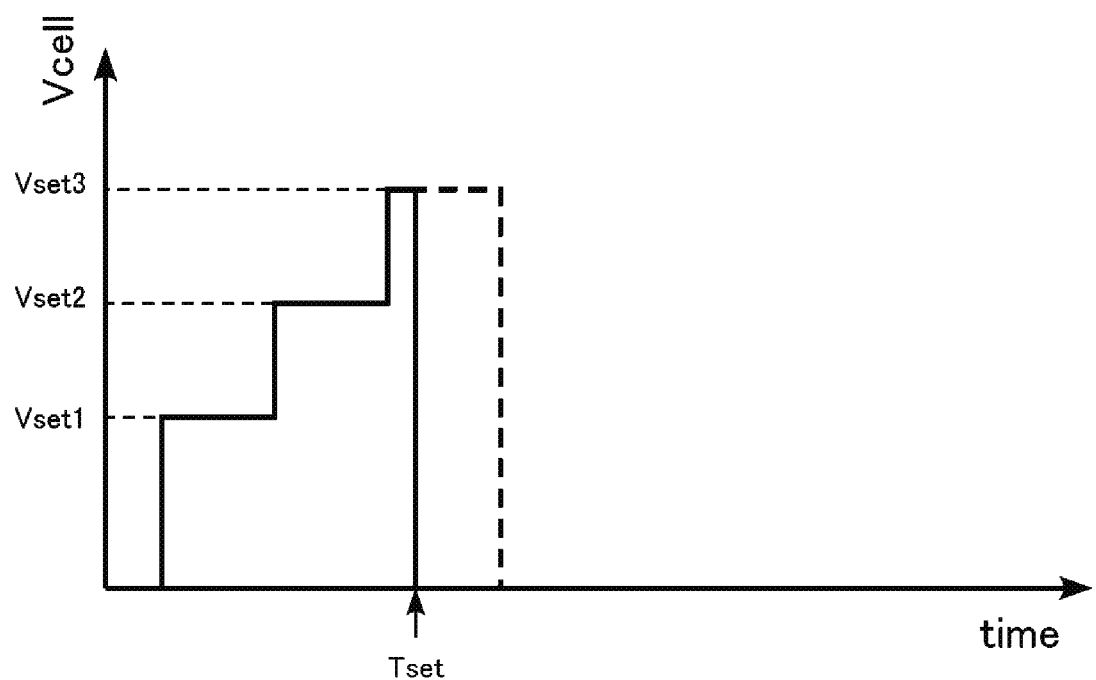
FIG. 7 is a diagram illustrating the operations and effects of the storage device according to the first embodiment.

FIG. 7 is a diagram illustrating the operations and effects of the storage device according to the first embodiment. In FIG. 7, a horizontal axis represents a time, and a vertical axis represents a voltage to be applied to the memory cell (Vcell).

In the resistive random access memory 100 according to the first embodiment, the output from the voltage sense transistor VT1 is monitored by the central control circuit 130 while the write voltage to the memory cell MC1 is increased from Vset1 to Vset2 and then, to Vset3 in a stepwise manner, for example, as illustrated in FIG. 7.

The output from the voltage sense transistor VT1 is transmitted to the central control circuit 130 through, for example, the common drain line CD1. The central control circuit 130 controls a voltage to be applied between the word line WL1 and the local bit line LBL1.

For example, when the central control circuit 130 receives a signal indicating that the output from the voltage sense transistor VT1 has increased, that is, a signal indicating that the write operation to the memory cell MC1 has been completed, the central control circuit 130 issues a command to at least one of the word line control circuit 110 and the bit line control circuit 120 and stops the application of the write voltage between the word line WL1 and the local bit line LBL1.

As illustrated in FIG. 7, the application of the write voltage between the word line WL1 and the local bit line LBL1 is stopped at the time Tset when the write operation to the memory cell is completed. For example, a large current does not flow to the variable resistance element R1 after the write operation is completed, unlike the comparative example of FIG. 5, i.e., the write voltage Vset3 continues to be applied for a predetermined period of time. Accordingly, a deterioration in characteristics of the memory cell MC1 is prevented, and the reliability of the resistive random access memory is improved. Specifically, the number of times the memory cell MC1 is rewritable is increased, and an improvement in endurance characteristics is achieved.

Further, in the resistive random access memory 100 according to the first embodiment, it is possible to directly detect completion of write operation to a memory cell. Therefore, it is possible to reduce the number of verification operations in a set operation. Alternatively, it is possible to completely omit the verification operation in the set operation. A time required for the set operation is reduced by a time required for the verification operation. Accordingly, the resistive random access memory 100 can perform a high-speed set operation.

As described above, according to the first embodiment, a storage device with improved reliability can be provided. In addition, a storage device that can perform a high-speed set operation can be provided.

Second Embodiment

A storage device according to a second embodiment is different from the storage device according to the first embodiment in the structure of the first transistor. Hereinafter, the description overlapping with the first embodiment will be partially omitted.

Figure 8:
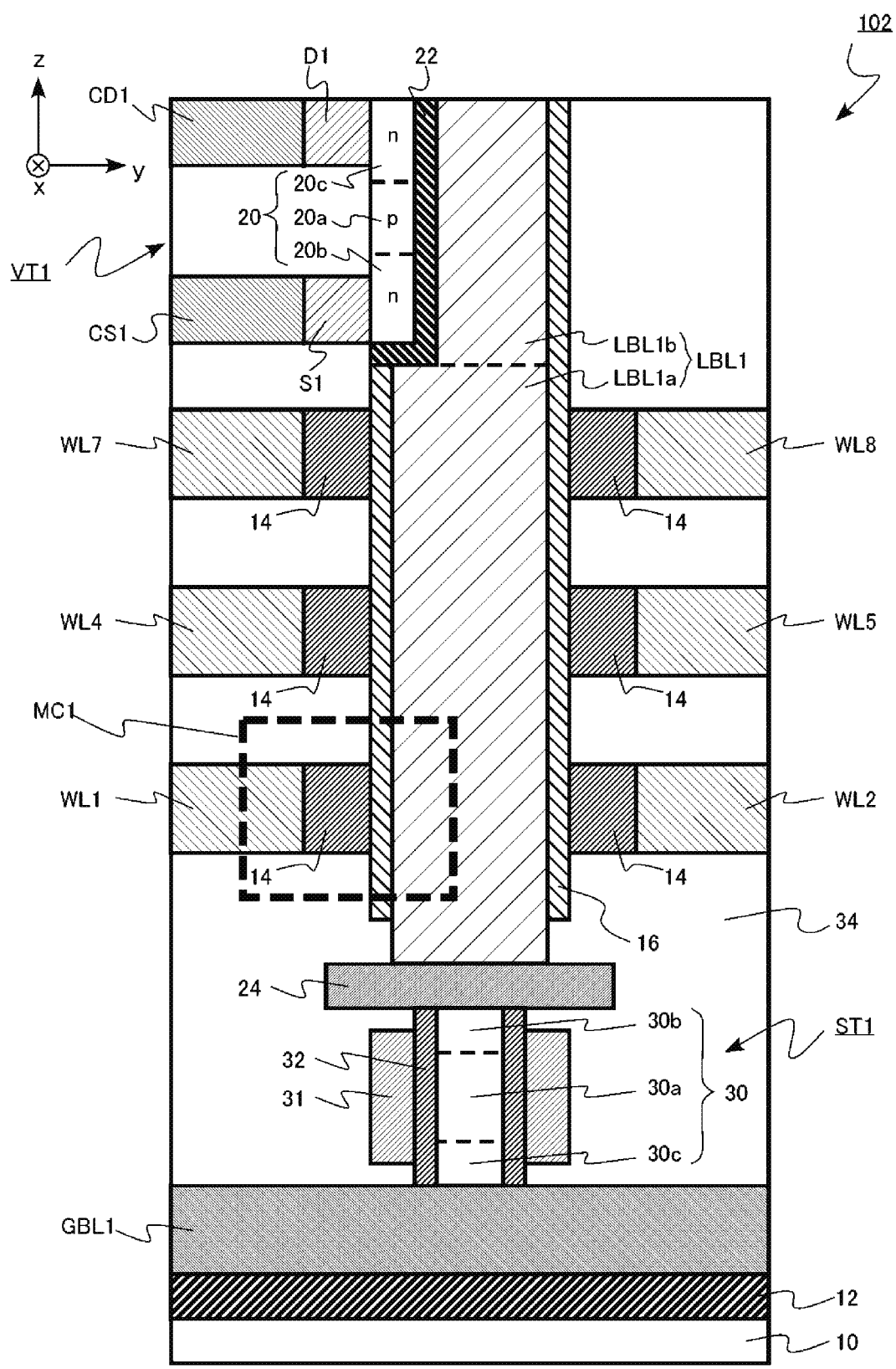
FIG. 8 is a schematic cross-sectional view of a memory cell array of a storage device according to a second embodiment.

FIG. 8 is a schematic cross-sectional view of a memory cell array of the storage device according to the second embodiment. FIG. 8 is a yz cross-sectional view including the local bit line LBL1 of FIG. 2. A yz cross-section of a local bit line LBL other than the local bit line LBL1 is also the same as that in FIG. 8.

FIG. 8 illustrates the word line WL1, the word line WL2, the word line WL4, the word line WL5, the word line WL7, and the word line WL8 among the plurality of word lines WL. FIG. 8 illustrates the local bit line LBL1 and the global bit line GBL1. FIG. 8 illustrates the voltage sense transistor VT1. FIG. 8 illustrates the source electrode S1 and the drain electrode D1. FIG. 8 illustrates the common source line CS1 and the common drain line CD1. FIG. 8 illustrates the select transistor ST1. In FIG. 8, a region surrounded by dashed lines is the memory cell MC1.

A memory cell array 102 includes the semiconductor substrate 10, the substrate insulating layer 12, the variable resistance layer 14, the switching element layer 16, the semiconductor layer 20, the gate insulating layer 22, the pad layer 24, the semiconductor layer 30, the gate electrode 31, the gate insulating layer 32, and the interlayer insulating layer 34.

The voltage sense transistor VT1 includes the semiconductor layer 20, the source electrode S1, the drain electrode D1, the gate electrode G1, and the gate insulating layer 22.

The semiconductor layer 20 is provided on a side surface of the upper end of the local bit line LBL1. A drain current of the voltage sense transistor VT1 flows into the z-direction.

The common source line CS1 and the common drain line CD1 extend in the x-direction. The common drain line CD1 is provided above the common source line CS1.

In the voltage sense transistor VT1 according to the second embodiment, the semiconductor layer 20 is provided at the side of the local bit line LBL1. As a result, a channel length of the semiconductor layer 20 is easily increased in the z-direction. Therefore, for example, an off-leak current of the voltage sense transistor VT1 is easily reduced.

As described above, according to the second embodiment, a storage device with improved reliability can be provided, similar to the first embodiment. In addition, a storage device that can perform a high-speed set operation can be provided.

Third Embodiment

A storage device according to a third embodiment is different from the storage devices according to the first and second embodiments in the structure of the first transistor. Hereinafter, the description overlapping with the first and second embodiments will be partially omitted.

Figure 9:
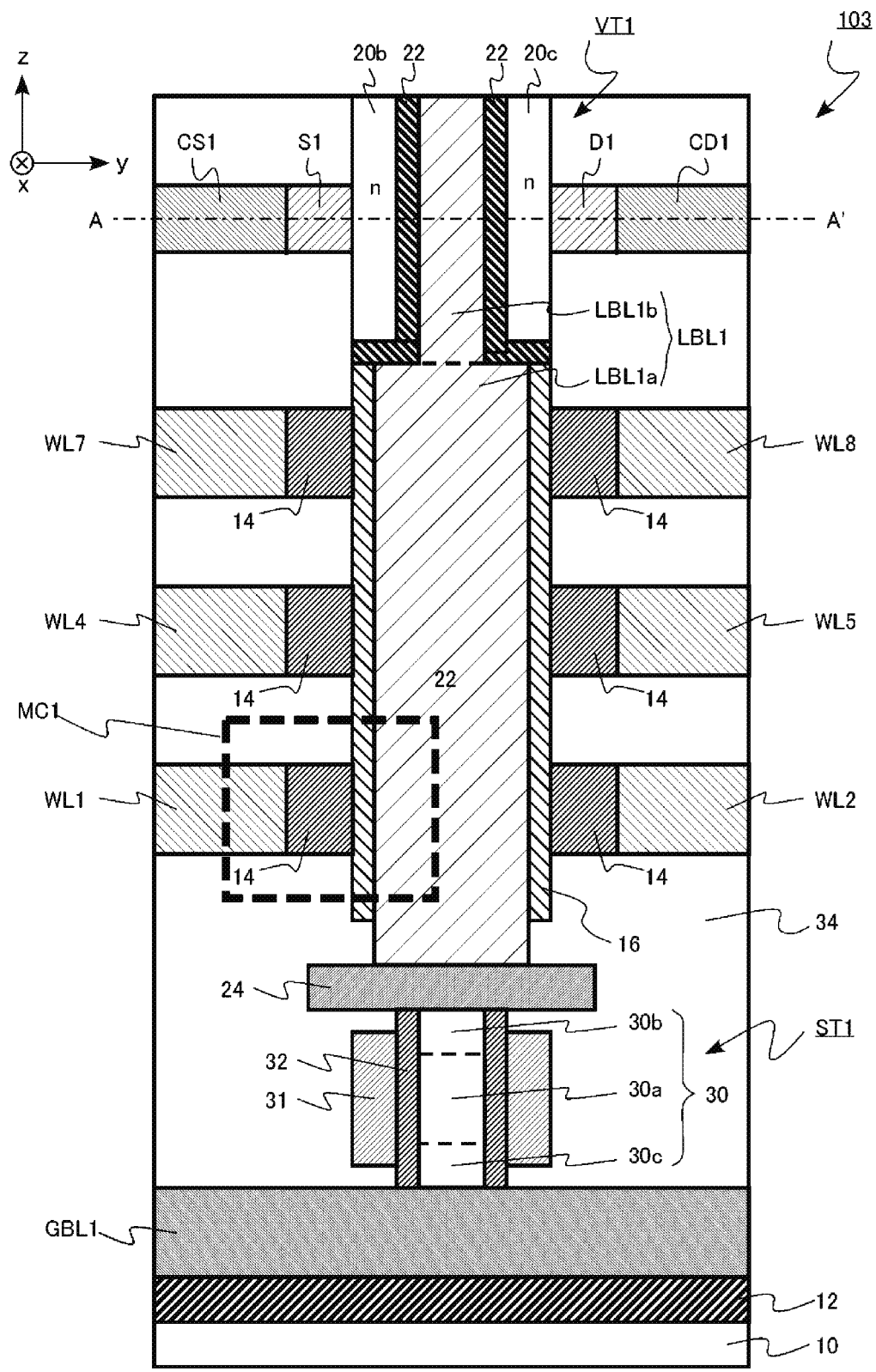
FIG. 9 is a schematic cross-sectional view of a memory cell array of a storage device according to a third embodiment.

FIG. 9 is a schematic cross-sectional view of a memory cell array of the storage device according to the third embodiment. FIG. 9 is a yz cross-sectional view including the local bit line LBL1 of FIG. 2. A yz cross-section of a local bit line LBL other than the local bit line LBL1 is also the same as that in FIG. 9.

FIG. 9 illustrates the word line WL1, the word line WL2, the word line WL4, the word line WL5, the word line WL7, and the word line WL8 among the plurality of word lines WL. FIG. 9 illustrates the local bit line LBL1 and the global bit line GBL1. FIG. 9 illustrates the voltage sense transistor VT1. FIG. 9 illustrates the source electrode S1 and the drain electrode D1. FIG. 9 illustrates the common source line CS1 and the common drain line CD1. FIG. 9 illustrates the select transistor ST1. In FIG. 9, a region surrounded by dashed lines is the memory cell MC1.

A memory cell array 103 includes the semiconductor substrate 10, the substrate insulating layer 12, the variable resistance layer 14, the switching element layer 16, the semiconductor layer 20, the gate insulating layer 22, the pad layer 24, the semiconductor layer 30, the gate electrode 31, the gate insulating layer 32, and the interlayer insulating layer 34.

The voltage sense transistor VT1 includes the semiconductor layer 20, the source electrode S1, the drain electrode D1, the gate electrode G1, and the gate insulating layer 22.

Figure 10:
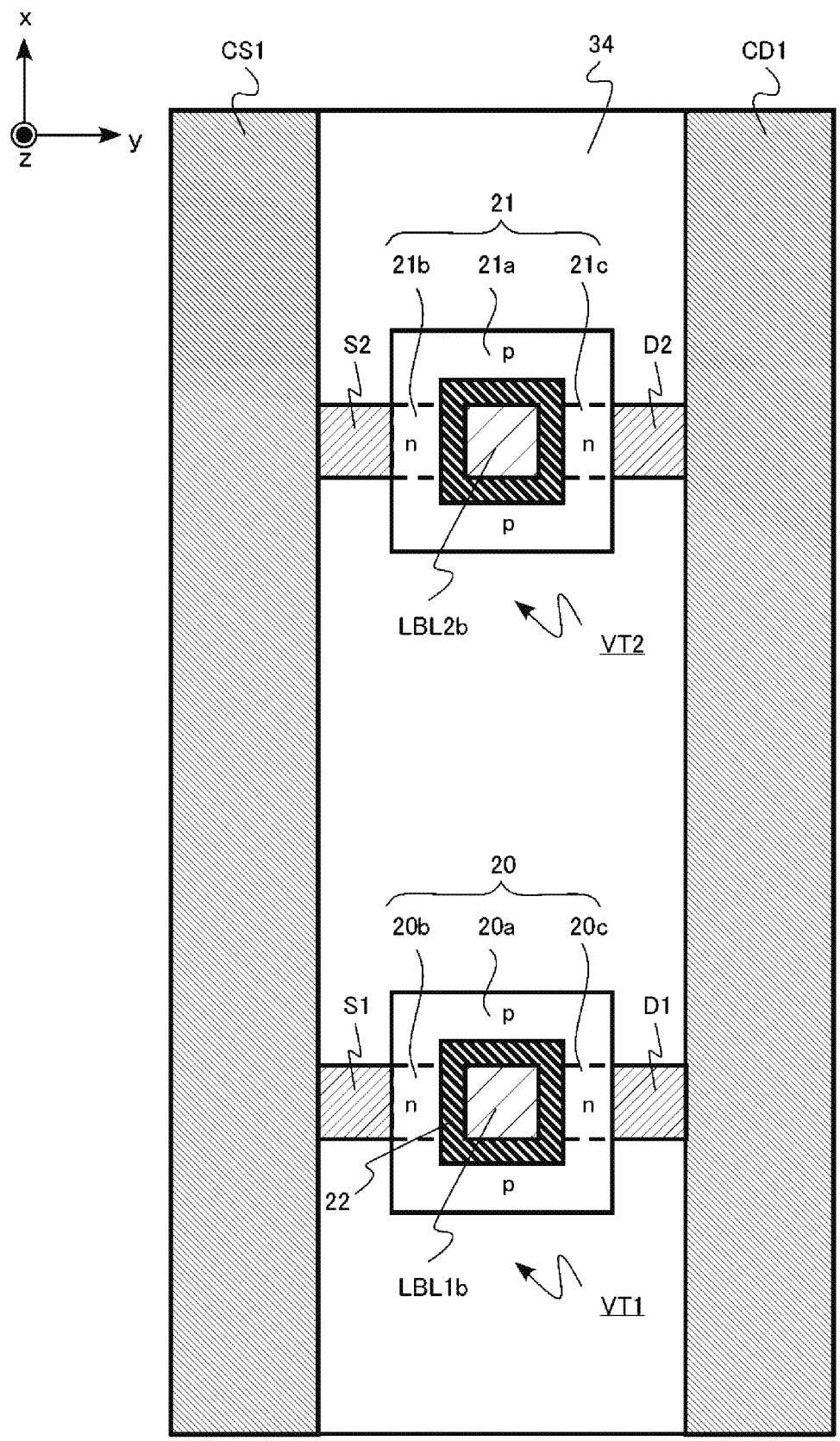
FIG. 10 is a schematic cross-sectional view of the memory cell array of the storage device according to the third embodiment.

FIG. 10 is a schematic cross-sectional view of a memory cell array of the storage device according to the third embodiment. FIG. 10 is a cross-sectional view taken along line A-A' in FIG. 9.

FIG. 10 illustrates the local bit line LBL1, the local bit line LBL2, the common source line CS1, the common drain line CD1, and the interlayer insulating layer 34. FIG. 10 illustrates the semiconductor layer 20, the source electrode S1, and the drain electrode D1, which make up the voltage sense transistor VT1. FIG. 10 illustrates the semiconductor layer 21, the source electrode S2, and the drain electrode D2, which make up the voltage sense transistor VT2.

The semiconductor layer 20 surrounds the gate electrode region LBL1b of the local bit line LBL1. The semiconductor layer 21 surrounds the gate electrode region LBL2b of the local bit line LBL2. The semiconductor layer 20 includes the channel region 20a, the source region 20b, and the drain region 20c.

The semiconductor layer 21 surrounds the gate electrode region LBL2b of the local bit line LBL2. The semiconductor layer 21 surrounds the gate electrode region LBL2b of the local bit line LBL2. The semiconductor layer 21 includes the channel region 21a, the source region 21b, and the drain region 21c.

The source electrode S1 and the source electrode S2 are electrically connected to each other through the common source line CS1. The drain electrode D1 and the drain electrode D2 are electrically connected to each other through the common drain line CD1.

In the voltage sense transistor VT1 according to the third embodiment, the semiconductor layer 20 is provided in the vicinity of the local bit line LBL1, and thus a channel width of the semiconductor layer 20 is easily increased by increasing the length of the semiconductor layer 20 in the z-direction. Therefore, for example, an on-current of the voltage sense transistor VT1 is easily increased.

As described above, according to the third embodiment, a storage device with improved reliability can be provided, similar to the first embodiment. In addition, a storage device that can perform a high-speed set operation can be provided.

Fourth Embodiment

A storage device according to a fourth embodiment is different from the storage device according to the first embodiment in the direction in which the common source line CS1, the common drain line CD1, the common source line CS2, and the common drain line CD2 extend. Hereinafter, the description overlapping with the first embodiment will be partially omitted.

Figure 11:
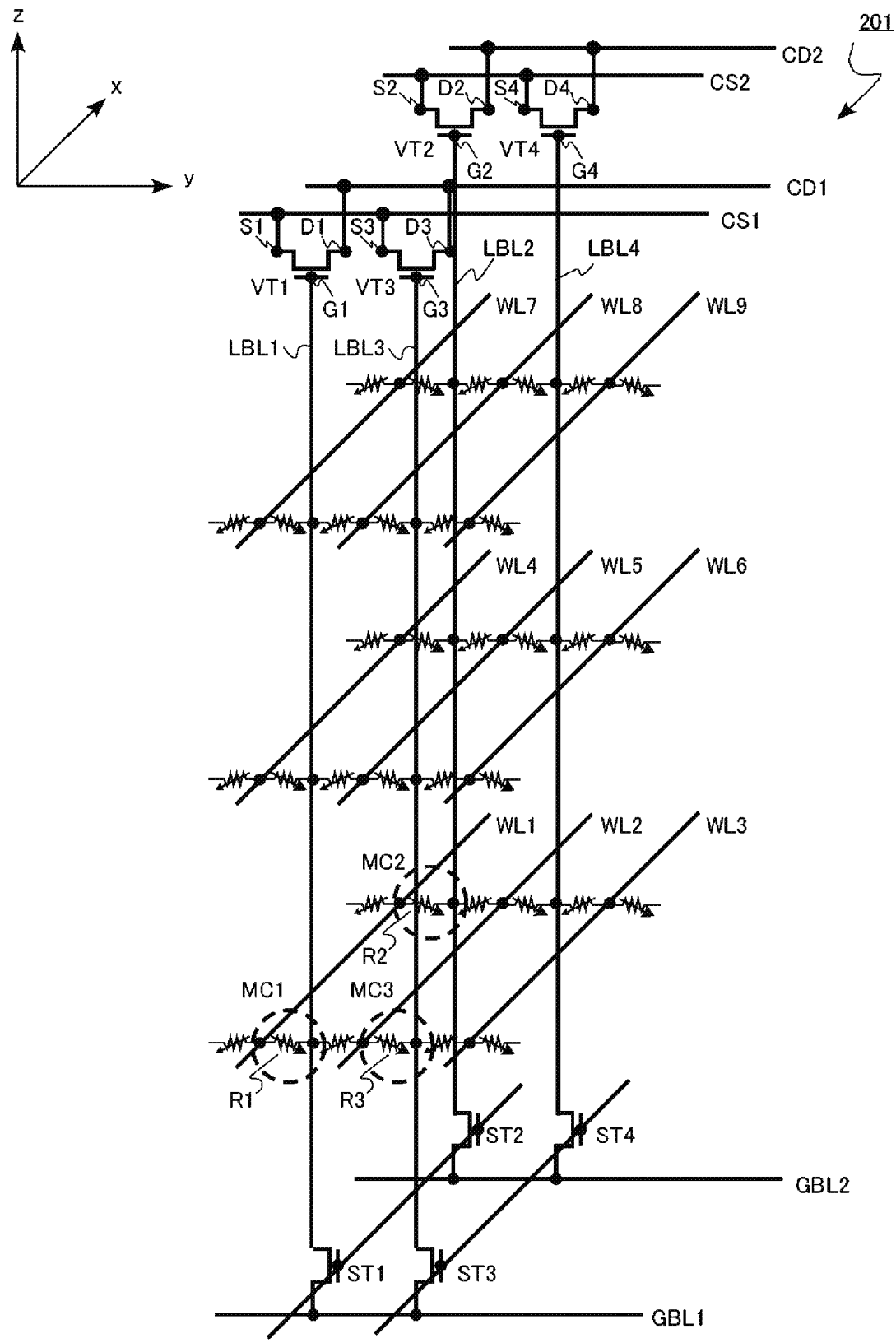
FIG. 11 is an equivalent circuit diagram of a memory cell array of a storage device according to a fourth embodiment.

FIG. 11 is an equivalent circuit diagram of a memory cell array of the storage device according to the fourth embodiment. A memory cell array 201 according to the fourth embodiment includes a three-dimensional structure in which memory cells MC are three-dimensionally arranged.

In the memory cell array 201 according to the fourth embodiment, voltage sense transistors VT1 to VT4 are provided above the plurality of local bit lines LBL. The voltage sense transistors VT1 to VT4 respectively include source electrodes S1 to S4, drain electrodes D1 to D4, and gate electrodes G1 to G4.

The gate electrodes G1 to G4 are electrically connected to local bit lines LBL1 to LBL4. The voltage sense transistors VT1 to VT4 have a function of detecting changes in the voltages of the local bit lines LBL1 to LBL4.

For example, the voltage sense transistor VT1 includes the source electrode S1, the drain electrode D1, and the gate electrode G1. The gate electrode G1 is electrically connected to the local bit line LBL1. The voltage sense transistor VT1 has a function of detecting a change in the voltage of the local bit line LBL1.

For example, the voltage sense transistor VT2 includes the source electrode S2, the drain electrode D2, and the gate electrode G2. The gate electrode G2 is electrically connected to the local bit line LBL2. The voltage sense transistor VT2 has a function of detecting a change in the voltage of the local bit line LBL2.

For example, the voltage sense transistor VT3 includes the source electrode S3, the drain electrode D3, and the gate electrode G3. The gate electrode G3 is electrically connected to the local bit line LBL3. The voltage sense transistor VT3 has a function of detecting a change in the voltage of the local bit line LBL3.

The common source line CS1, the common drain line CD1, the common source line CS2, and the common drain line CD2 extend in the y-direction. The source electrode S1 and the source electrode S3 are electrically connected to each other through the common source line CS1. The drain electrode D1 and the drain electrode D3 are electrically connected to each other through the common drain line CD1. The source electrode S2 and the source electrode S4 are electrically connected to each other through the common source line CS2. The drain electrode D2 and the drain electrode D4 are electrically connected to each other through the common drain line CD2.

The common drain line CD1 and the common drain line CD2 are electrically connected to the central control circuit 130. The common drain line CD1 and the common drain line CD2 have a function of transmitting outputs from the voltage sense transistors VT1 to VT4 to the central control circuit 130.

The memory cell array 201 according to the fourth embodiment is different from the memory cell array 101 according to the first embodiment in that a direction in which the common source line CS1, the common drain line CD1, the common source line CS2, and the common drain line CD2 extend is not the x-direction but the y-direction.

Meanwhile, structures of the voltage sense transistors VT1 to VT4 according to the fourth embodiment may be the same as the structures of the voltage sense transistors VT1 to VT4 according to the first embodiment, the second embodiment, or the third embodiment.

As described above, according to the fourth embodiment, a storage device with improved reliability can be provided, similar to the first embodiment. In addition, a storage device that can perform a high-speed set operation can be provided.

While the first to fourth embodiments show a case where the variable resistance element contains a chalcogenide, the present disclosure is not limited to the case where the variable resistance element contains a chalcogenide.

Further, while the first to fourth embodiments show a case where the select transistors ST1 to ST4 are provided below the local bit lines LBL, that is, on a side of the semiconductor substrate 10, and the voltage sense transistors VT1 to VT4 are provided above the local bit lines LBL, other configurations may be adopted in which the voltage sense transistors VT1 to VT4 are provided below the local bit lines LBL, that is, on a side of the semiconductor substrate 10, and the select transistors ST1 to ST4 are provided above the local bit lines LBL.

Further, while the first to fourth embodiments show a case where an end of the local bit line LBL is the gate electrode of the voltage sense transistor has been described, other structures may also be adopted, for example, in which a leader line is provided in the local bit line LBL and, for example, the leader line is connected to the gate electrode of the voltage sense transistor formed in the semiconductor substrate 10.

Further, while the first to fourth embodiments show a case where the local bit line LBL extends in a direction perpendicular to the surface of the semiconductor substrate 10, for example, other memory cell array structures may also be adopted in which the word lines WL and the local bit lines LBL extend in a direction parallel to the surface of the semiconductor substrate 10.

Further, while the first to fourth embodiments show a case where the common source line CS1 and the common source line CS2 are two different wirings, the common source line CS1 and the common source line CS2 may also be integrated into one wiring.

Further, the first to fourth embodiments show a case where an independent central control circuit 130 is provided. However, the function of the control circuit may be performed by the word line control circuit 110 or the bit line control circuit 120.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   a first conductive layer that extends in a first direction;
   a second conductive layer that extends in a second direction intersecting the first direction;
   a third conductive layer that extends in a third direction intersecting the first and second directions;
   a first transistor that includes a first gate electrode electrically connected to the second conductive layer;
   a first selection transistor having a first end electrically connected to the third conductive layer and a second end electrically connected to the second conductive layer;
   a first memory cell including a first variable resistance element electrically connected between the first and second conductive layers and to a node of the second conductive layer that is between the first gate electrode of the first transistor and the second end of the first selection transistor;
   a control circuit configured to turn on the first selection transistor to electrically connect the first memory cell to the third conductive layer during a write operation performed on the first memory cell;
   a fourth conductive layer that extends in the second direction;
   a second memory cell having a second variable resistance element electrically connected between the first and fourth conductive layers; and
   a second transistor that includes a second gate electrode electrically connected to the fourth conductive layer, wherein the first transistor includes a first source electrode and a first drain electrode,
the second transistor includes a second source electrode and a second drain electrode, and
the first and second source electrodes are electrically connected to each other, and the first and second drain electrodes are electrically connected to each other.

2. The storage device according to claim 1, further comprising:
a first wiring that extends in the first direction and is electrically connected to the first and second source electrodes, and
a second wiring that extends in the first direction and is electrically connected to the first and second drain electrodes.

3. A storage device comprising:
a first conductive layer that extends in a first direction;
a second conductive layer that extends in a second direction intersecting the first direction;
a third conductive layer that extends in a third direction intersecting the first and second directions;
a first transistor that includes a first gate electrode electrically connected to the second conductive layer;
a first selection transistor having a first end electrically connected to the third conductive layer and a second end electrically connected to the second conductive layer;
a first memory cell including a first variable resistance element electrically connected between the first and second conductive layers and to a node of the second conductive layer that is between the first gate electrode of the first transistor and the second end of the first selection transistor; and
a control circuit configured to turn on the first selection transistor to electrically connect the first memory cell to the third conductive layer during a write operation performed on the first memory cell, wherein
the first gate electrode is formed on a side portion of the second conductive layer,
the first transistor includes:
a first semiconductor layer, and
a first gate insulating layer between the first gate electrode and the first semiconductor layer,
a first wiring that extends in the first direction and is electrically connected to a source electrode formed on one end of the first semiconductor layer, and
a second wiring that extends in the first direction and is electrically connected to a drain electrode formed on the other end of the first semiconductor layer.

4. A storage device comprising:
a first conductive layer that extends in a first direction;
a second conductive layer that extends in a second direction intersecting the first direction;
a third conductive layer that extends in a third direction intersecting the first and second directions;
a first transistor that includes a first gate electrode electrically connected to the second conductive layer;
a first selection transistor having a first end electrically connected to the third conductive layer and a second end electrically connected to the second conductive layer;
a first memory cell including a first variable resistance element electrically connected between the first and second conductive layers and to a node of the second conductive layer that is between the first gate electrode of the first transistor and the second end of the first selection transistor; and
a control circuit configured to turn on the first selection transistor to electrically connect the first memory cell to the third conductive layer during a write operation performed on the first memory cell, wherein
the first gate electrode is formed on an end portion of the second conductive layer, and the first transistor includes
a first semiconductor layer surrounding the first gate electrode, and
a first gate insulating layer between the first gate electrode and the first semiconductor layer.

5. The storage device according to claim 4, further comprising:
a first wiring that extends in the first direction and is electrically connected to a source electrode of the first transistor, and
a second wiring that extends in the first direction and is electrically connected to a drain electrode of the first transistor.

6. A storage device comprising:
a first conductive layer that extends in a first direction;
a second conductive layer that extends in a second direction intersecting the first direction;
a third conductive layer that extends in a third direction intersecting the first and second directions;
a first transistor that includes a first gate electrode electrically connected to the second conductive layer;
a first selection transistor having a first end electrically connected to the third conductive layer and a second end electrically connected to the second conductive layer;
a first memory cell including a first variable resistance element electrically connected between the first and second conductive layers and to a node of the second conductive layer that is between the first gate electrode of the first transistor and the second end of the first selection transistor;
a control circuit configured to turn on the first selection transistor to electrically connect the first memory cell to the third conductive layer during a write operation performed on the first memory cell;
a fourth conductive layer that extends in the first direction;
a fifth conductive layer that extends in the second direction;
a second memory cell having a second variable resistance element electrically connected between the fourth and fifth conductive layers; and
a second transistor that includes a second gate electrode electrically connected to the fifth conductive layer, wherein
the first transistor includes a first source electrode and a first drain electrode,
the second transistor includes a second source electrode and a second drain electrode, and
the first and second source electrodes are electrically connected to each other, and the first and second drain electrodes are electrically connected to each other.

7. The storage device according to claim 6, further comprising:
a first wiring that extends in a third direction intersecting both the first and second directions and is electrically connected to the first and second source electrodes, and
a second wiring that extends in the third direction and is electrically connected to the first and second drain electrodes.

8. The storage device according to claim 6, further comprising:
a second selection transistor that controls a current flowing between the fifth and third conductive layers.

9. The storage device according to claim 8, wherein
the second variable resistance element is electrically connected to a node of the fifth conductive layer that is between the second gate electrode of the second transistor and the second selection transistor, and
the control circuit is configured to turn on the second selection transistor to electrically connect the second memory cell to the third conductive layer during the write operation performed on the second memory cell.

10. The storage device according to claim 1, wherein the control circuit is further configured to, during the write operation performed on the first memory cell, detect a change in a current that flows through the first transistor and control a voltage applied to the first variable resistance element based on the detected change in the current.

11. The storage device according to claim 10, wherein the control circuit is further configured to, during a write operation performed on the second memory cell, detect a change in a current that flows through the second transistor and control a voltage applied to the second variable resistance element based on the detected change in the current that flows through the second transistor.

12. The storage device according to claim 6, wherein the control circuit is further configured to, during the write operation performed on the first memory cell, detect a change in a current that flows through the first transistor and control a voltage applied to the first variable resistance element based on the detected change in the current.

13. The storage device according to claim 12, wherein the control circuit is further configured to, during a write operation performed on the second memory cell, detect a change in a current that flows through the second transistor and control a voltage applied to the second variable resistance element based on the detected change in the current that flows through the second transistor.

* * * * *